United States Patent [19]

Hill

[11] 4,091,326
[45] May 23, 1978

[54] METHOD AND APPARATUS FOR EQUIPOTENTIAL PLANE DETECTION

[75] Inventor: Maynard L. Hill, Silver Spring, Md.

[73] Assignee: The Johns Hopkins University, Baltimore, Md.

[21] Appl. No.: 524,334

[22] Filed: Nov. 15, 1974

Related U.S. Application Data

[62] Division of Ser. No. 301,363, Oct. 27, 1972, Pat. No. 3,868,074.

[51] Int. Cl.² ............................................. G01R 31/02
[52] U.S. Cl. ......................................... 324/72; 324/32
[58] Field of Search ................................... 324/72, 32

[56] References Cited

U.S. PATENT DOCUMENTS

2,454,630  11/1948  Buckthal ........................... 324/32 X

OTHER PUBLICATIONS

Clark, John F., "Air Borne Measurement of Atmospheric Potential Gradient", Jour. of Geo. Physical Res., vol. 62, No. 4, Dec. 1957, pp. 617–628.

MacCready, Jr., Paul B., "Improved Thermal Soaring Flight Techniques", Soaring, Dec. 1961, pp. 6–11.

*Primary Examiner*—John K. Corbin
*Assistant Examiner*—Rolf Hille
*Attorney, Agent, or Firm*—Robert E. Archibald; Marc A. Block

[57] ABSTRACT

A method and apparatus for utilizing the earth's static electric field as a reference for generating an information-bearing electrical signal. In a particular embodiment, the invention provides a differential static voltmeter having spaced voltage sensing probes and a differential static amplifier which determines the difference in voltage sensed by the probes. Since the probes measure the static voltage which occurs as a vertically oriented gradient in the earth's atmosphere, the voltage difference signal produced by the differential static amplifier is a measure of the disposition of the probes relative to a line usually parallel to the earth's surface, the voltmeter thereby being particularly useful as a pitch and roll stabilization reference and control system for airborne vehicles. In other embodiments, the invention also provides apparatus for defining a horizontal reference plane in the atmosphere and apparatus for sensing the roll or pitch rate of an airborne vehicle.

10 Claims, 8 Drawing Figures

METHOD AND APPARATUS FOR EQUIPOTENTIAL PLANE DETECTION

STATEMENT OF GOVERNMENT INTEREST

The invention disclosed and claimed herein resulted from work performed under or in the course of a contract with the Department of the Navy.

This is a divisional of application Ser. No. 301,363, filed oct. 27, 1972, now U.S. Pat. No. 3,868,074.

BACKGROUND AND SUMMARY OF THE INVENTION

The existence of a static electric field in the earth's atmosphere has long been recognized. More recently, this static electric field was determined to exhibit a vertical potential gradient, the change in potential per meter decreasing with increasing altitude. At any altitude, however, equipotential lines and planes are essentially horizontal, especially in a localized area. The ability to define a horizontal equipotential line or plane in the atmosphere would provide a reference for aircraft stabilization, gyroscopic drift correction, or clean air turbulence detection inter alia. Additionally, detection of tilted equipotential planes or lines in the vicinity of various physical objects provides a reference for obstacle avoidance apparatus.

In particular, the present invention provides related methods and preferred means for utilizing the earth's static field existing therein, to obtain a reference signal which can be employed to control both pitch and roll axes stabilization of airborne vehicles. In a general sense, the invention provides for continuously defining an equipotential line or plane within the earth's vertical static potential gradient. Definition of this equipotential line or plane is indicated by a simple DC voltage signal produced by the preferred apparatus of the invention, this signal being usable to accomplish a variety functions. The invention further relates to a general method for continuously defining an equipotential line or plane in the earth's vertical static potential gradient. The method comprises immersion of at least two voltage sensing probes in the earth's static potential gradient and measuring the difference in the static voltage sensed by the two probes. If the two probes sense the same voltage, i.e., the difference between the sensed voltage is zero, then the probes usually lie on a horizontal line of equal potential due to the vertical nature of the earth's static potential gradient. Similarly, a horizontal equipotential plane may be defined by two pairs of voltage sensing probes or by three probes, one of which is referenced to the electrical center of the other two probes. Nonhorizontal equipotential planes and lines may be sensed in similar fashion in those areas where the vertical gradient is distorted due to physical objects or ionization sources.

The preferred apparatus of the present invention comprises voltage sensing probes (which probes may be comprised of radioactive material in order to increase the electrical contact thereof with the atmosphere) and a differential static amplifier. The amplifier receives the sensed potentials from the probes and measures the difference in the sensed potentials to produce a voltage difference signal which may be utilized to control a servomechanical or other apparatus. The voltage sensing probe/differential static amplifier combination is referred to hereinafter as a differential static voltmeter. The actual or effective combination of two differential static voltmeters can essentially define an equipotential plane in the earth's vertical static potential gradient. Since this equipotential plane is defined within a relatively small space, the plane is essentially horizontal and may be used as a reference plane for aircraft stabilization inter alia.

If the sensing probes described above are attached to the wingtips of an aircraft or essentially along the transverse axis thereof, then the voltage difference between the probes measured by the differential static amplifier is a function of the roll angle of the aircraft. Similarly, the voltage difference sensed by a pair of sensing probes disposed essentially along the longitudinal axis of an aircraft is a function of the pitch angle of the aircraft. The differential voltage output signals thus produced for the pitch and roll orientations of the aircraft can be used to drive a servomechanical system to maintain the aircraft in level flight relative to the surface of the earth. The sensing probes need not be exactly aligned with or parallel to the transverse or longitudinal axes of the aircraft in order to produce useful information. Similarly, the probes need not be positioned at exactly the same elevation relative either to the earth's surface or to the horizontal axis of the aircraft.

The invention also relates to a method and apparatus for measuring the roll rate or pitch rate of an airborne vehicle. The apparatus used to sense rate comprises a pair of conductive wires disposed essentially along or parallel to the transverse axis or longitudinal axis of the aircraft. Rotation of these wires in the earth's static electric field generates a current in the wires. The generated current is measured by a current meter, the intensity of the current being proportional to the roll rate or pitch rate of the vehicle.

Thus it is an object of the invention to provide a method and apparatus for continuously defining an equipotential line or plane in the earth's static electric field.

It is another object of the invention to provide differential voltage sensing apparatus aboard an airborne vehicle, the differential voltage sensed by said apparatus being a function of the roll or pitch attitude angle of the vehicle.

It is a further object of the invention to provide a differential static current meter for determining the roll rate or pitch rate of an airborne vehicle by measuring the current induced in a pair of conductive wires rotated in the earth's static potential gradient.

Further objects and advantages of the invention ill become more readily apparent in light of the following detailed description.

DESCRIPTION OF THE PREFERRED EMBODIMENTS

The several embodiments of the invention use the earth's static potential gradient as a reference for generating an information-bearing electrical signal. The generated signal may then be used to perform a variety of functions, a singularly valuable such function being the stabilization of an airborne vehicle. The invention essentially provides a method and means for measuring the difference in the earth's static potential field between two closely spaced points therein. In a simple form of the invention, a differential static voltmeter is utilized to generate a signal proportional to the misalignment of the axis joining two spaced sensors of the voltmeter with a line taken parallel to the surface of the earth. An effective combination of two differential static voltmeters can be used to define an equipotential plane within the earth's static potential gradient. The equipotential plane thus defined is usually essentially parallel to the earth's surface, thereby creating an artificial horizontal plane which can then be utilized for stabilization of an airborne vehicle in both pitch and roll modes. The invention thus contemplates utilization of the earth's static potential gradient to provide roll attitude and roll rate and/or pitch attitude and pitch rate information in the form of an easily applied DC signal.

Figure 1:
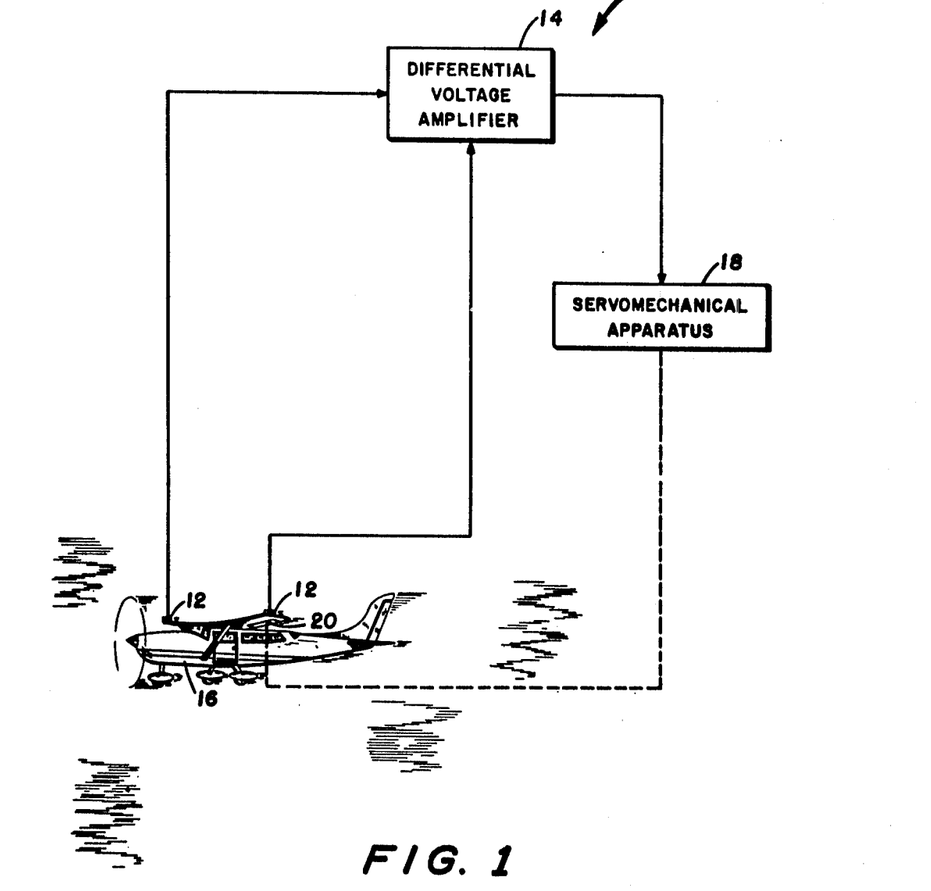
FIG. 1 is a schematic view of a differential static voltmeter mountable on an aircraft.
Figure 2:
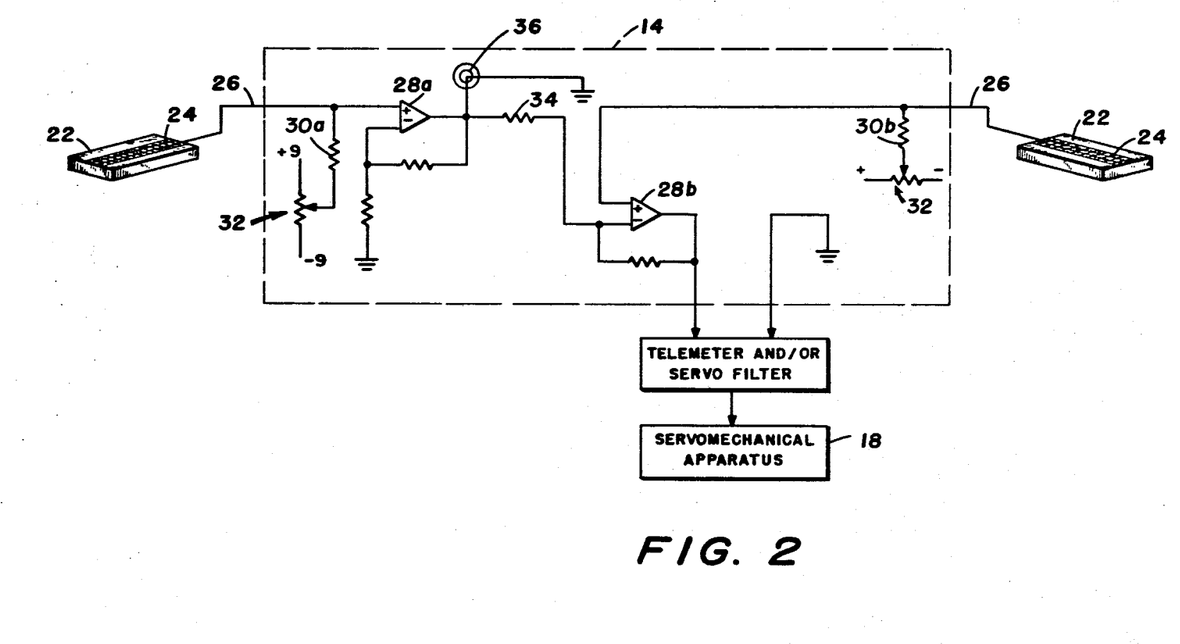
FIG. 2 is a detailed diagram of the circuitry of the voltmeter of FIG. 1.

Referring to FIGS. 1 and 2 a differential static voltmeter is seen at 10 to comprise two sensing probes 12 and a differential voltage amplifier 14, the probes 12 being mounted for illustration on the wingtips of an aircraft 16. The output signal of the voltmeter 10, i.e., essentially the output signal of the amplifier 14, is directed to well-known servomechanical apparatus 18 to accomplish a desired function, such as to ailerons 20 to provide roll stabilization. The sensing probes 12 may comprise metal pads 22 coated with a layer 24 of a radioactive metal or metal salt to increase the conductivity of the air in the vicinity of the probes by alpha particle emission (and resulting ionization of the air), thereby to improve the electrical contact of the probes with the air. The probes 12 may simply comprise conductive needle-like points or thin pointed metal wires, chemical sprays, hot gases, etc. The probes 12 respond rapidly to changes in the static voltage encountered in the atmosphere. The voltage sensed by the probes 12 produces a low impedance input to the differential voltage amplifier 14.

As can be particularly seen in FIG. 2, the probes 12 are electrically joined to the amplifier 14 by either coaxial cables or other electrical connections 26 to maintain a high insulation resistance in the probe wiring to avoid leakage paths. The differential voltage amplifier 14 comprises two operational amplifiers 28a and 28b, the amplifiers 28a and 28b receiving the inputs from one of each of the probes 12. Inserted in the circuit between each of the probe/amplifier combinations are resistors 30a and 30b joined in series to potentiometers 32. The resistors 30a and 30b cause a hgh impedance input into the operational amplifiers 28a and 28b. The output from amplifier 28a is fed through resistor 34 into the negative terminal of the amplifier 28b, the positive terminal of the amplifier 28b being received directly from the resistor 30b. The output signal resulting from the amplifier 28b, thus the signal generated within the differential voltage amplifier 14, is proportional to the voltage differential sensed by the two probes 12. If the probes 12 are level with respect to an ambient equipotential line or plane, a zero differential voltage results. Elevation of one of the probes 12 above the other probe produces a differential voltage signal proportional to the difference in elevation between the probes, the voltage difference resulting from the vertical static voltage gradient existing in the earth's atmosphere. The differential static voltmeter 10 can then be seen to be capable of performing a variety of functions, one of which being the stabilization in pitch or roll of an airborne vehicle. By disconnecting the probes 12 from the amplifier 14, the resistor 30a may be adjusted to zero volts at 36 and the resistor 30b adjusted to a desired output which represents a neutral horizontal gradient. Placement of one each of the probes 12 on the opposite wingtips of the aircraft 16 results in a static voltmeter output which is proportional to the bank angle of the aircraft 16. Similarly, a static voltmeter 10 having its probes 12 mounted effectively along the longitudinal axis of the aircraft 16 produces an output proportional to the drive or climb angle of said aircraft. The output signals from the static voltmeters 10 so mounted on the aircraft 16 can then be filtered and fed to the servomechanical apparatus 18. Pitch or roll stabilization may thus be accomplished. A combination of two static voltmeters 10 may be used to stabilize an airborne vehicle in both pitch and roll.

Figure 3:
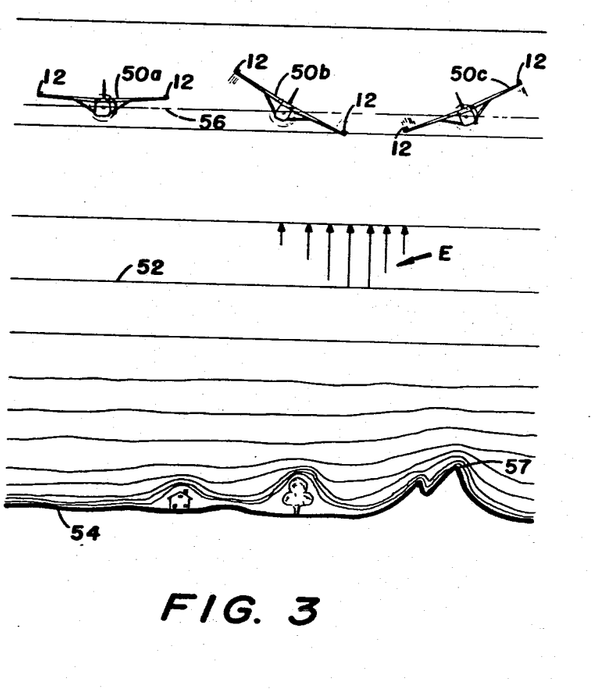
FIG. 3 is a schematic view of an aircraft illustrating roll orientations of the aircraft.

FIG. 3 shows three aircraft 50a, 50b, and 50c fitted with static voltmeters and operating in the static voltage field E, the probes 12 being visible on the wingtips of the aircraft. The field E is seen to exhibit a vertical gradient, the static potential per meter in the atmosphere decreasing with altitude. Thus, the lines 52 forming the static voltage field E are shown as parallel lines which are closer together near the earth's surface 54. The lines 52 are distorted and tilted about mountains 57 or other such obstacles. The aircraft 50a is seen to be operating in level flight the wingtips of the aircraft being aligned along a line 56 which is parallel to the earth's surface 54. The probes 12, which need not be fitted on the wingtips of the aircraft 50a but could be spaced closely together within a small unit mounted virtually anywhere on the aircraft, are aligned essentially along the horizontal line 56. However, greater mutual spacing of the probes 12 generally yields greater sensitivity to attitude misorientation of the aircraft. The probes 12 sense the same static voltage while in the roll attitude illustrated by the aircraft 50a, the voltmeter joined to the probes 12 producing a zero differential voltage output signal which indicates that the aircraft 50a has a zero roll angle. The aircraft 50b is shown to have a "left bank" roll orientation, i.e., the left wingtip of the aircraft is lower relative to the earth's surface than the right wingtip. In such an orientation, a differential voltage output signal is produced which is proportional to the difference in elevation of the probes 12 on the wingtips. This difference in probe elevation is geometrically proportional to the roll angle $\theta$ defined by the intersection of the horizontal line 56 and the straight line joining the probes 12. Similarly, the aircraft 50c has a "right bank" roll orientation, the difference in elevation between the probes 12 on the wingtips of the aircraft producing a voltmeter output which is proportional to the angular roll orientation of the aircraft. By defining the "left bank" orientation of the aircraft 50b as a positive roll angle and the "right bank" orientation of the aircraft 50c as a negative roll angle, the output of the voltmeter 10 can provide a pilot with an indication not only of the degree of the roll angle θ but also of the direction. As has previously been described, the output of the differential static voltmeter may be fed into well-known closed-loop servomechanical apparatus for automatically maintaining the aircraft 50b or 50c in a horizontal orientation.

Figure 4:
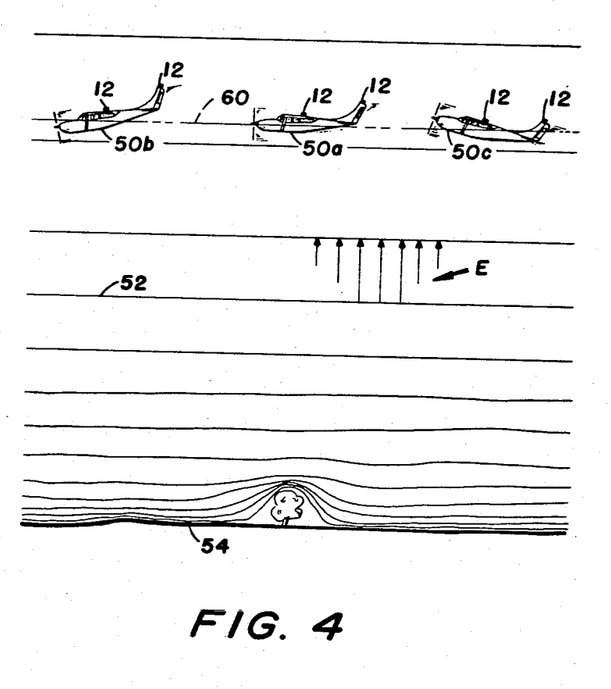
FIG. 4 is a schematic view of an aircraft illustrating pitch orientations of the aircraft.

FIG. 4 also shows the aircraft 50a, 50b, and 50c in the earth's static voltage field E, a side elevational view of the aircraft being shown such that the pitch angle φ of the aircraft relative to a horizontal line 60 may be observed. The longitudinal axis of the aircraft 50a is aligned parallel with the horizontal line 60, thereby being also parallel to the earth's surface 54, the probes 12 being disposed essentially along the longitudinal axis of the aircraft 50a. The probes 12 thus sense the same static voltage and the voltmeter to which the probes 12 are connected produces a zero differential voltage input signal which indicates that the aircraft has a zero pitch angle. The aircraft 50b is seen to be diving, or pitched downwardly, the probes 12 on the fore and aft of the aircraft 50b thereby having a different elevation. The probe 12 on the front of the aircraft 50b senses a more negative static voltage than does the probe 12 toward the rear of the aircraft. This sensed difference in voltage is reflected in the output signal of the differential static voltmeter to which the probes 12 are electrically connected, which output signal is proportional to the pitch angle φ formed by the intersection of the horizontal line 60 and the longitudinal axis of the aircraft. Similarly, the aircraft 50c is seen to be climbing, or pitched upwardly, the difference in elevation between the probes 12 on the aircraft producing a voltmeter output which is proportional to the angular pitch orientation of the aircraft. The voltmeter output may then be used to inform servomechanical apparatus of the magnitude and direction of the pitch angle φ of the aircraft so that the aircraft can be automatically stabilized.

Figure 5:
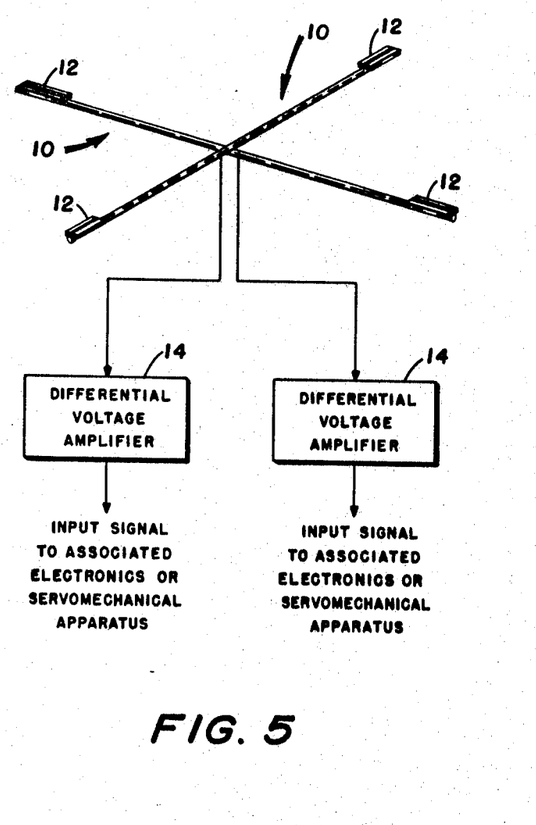
FIG. 5 is an idealized schematic view of an equipotential plane detector comprised of two differential static voltmeters.

Use of a pair of differential static voltmeters 10 such as is schematically shown in FIG. 5 allows definition of an equipotential plane within the static potential gradient in the atmosphere. Each pair of probes 12 in FIG. 5 may be considered to lie along a line or axis joining said probes. If these axes are turned at angles to each other such as the 90° angles shown in FIG. 5, then each voltmeter 10 will define an equipotential line when the output thereof is zero. When the output of both voltmeters 10 is zero, then the plane in which the four probes 12 lie would have a substantially equal static potential value at every point in the plane. Due to the relative localized measurement made by the voltmeters 10, the equipotential plane is usually parallel to the surface of the earth, thereby defining an artificial horizontal plane which may be used as a reference plane for a number of functions including aircraft stabilization, gyroscopic drift adjustment, turbulence detection and unmanned aircraft guidance. Each pair of probes 12 in each voltmeter 10 is electrically connected to a differential voltage amplifier 14 such as has previously been described. The output of each of the amplifiers 14 may be used to accomplish a desired function. For example, the output signals of the voltmeters 10 of FIG. 5 could be used to maintain an aircraft in level flight, one of said voltmeters 10 providing a signal to control servomechanical apparatus maintaining a zero pitch angle and the second voltmeter 10 maintaining a zero roll angle. Thus, the aircraft would be maintained in level flight within the equipotential plane defined by the pair of voltmeters 10. When the static potential gradient is tilted due to obstacles such as mountains, (as can be seen in FIG. 3), detection of the tilted equipotential plane is useful in preventing an airborne vehicle from colliding with the obstacle. For example, an aircraft stabilized in horizontal flight with respect to an essentially level portion of the earth's surface is capable of avoiding a mountain or hill which tilts the potential gradient. By sensing the tilted equipotential plane caused by the obstacle and stabilizing the aircraft with respect to the tilted equipotential plane, the aircraft automatically assumes the proper heading to fly over or around the obstacle.

Figure 6:
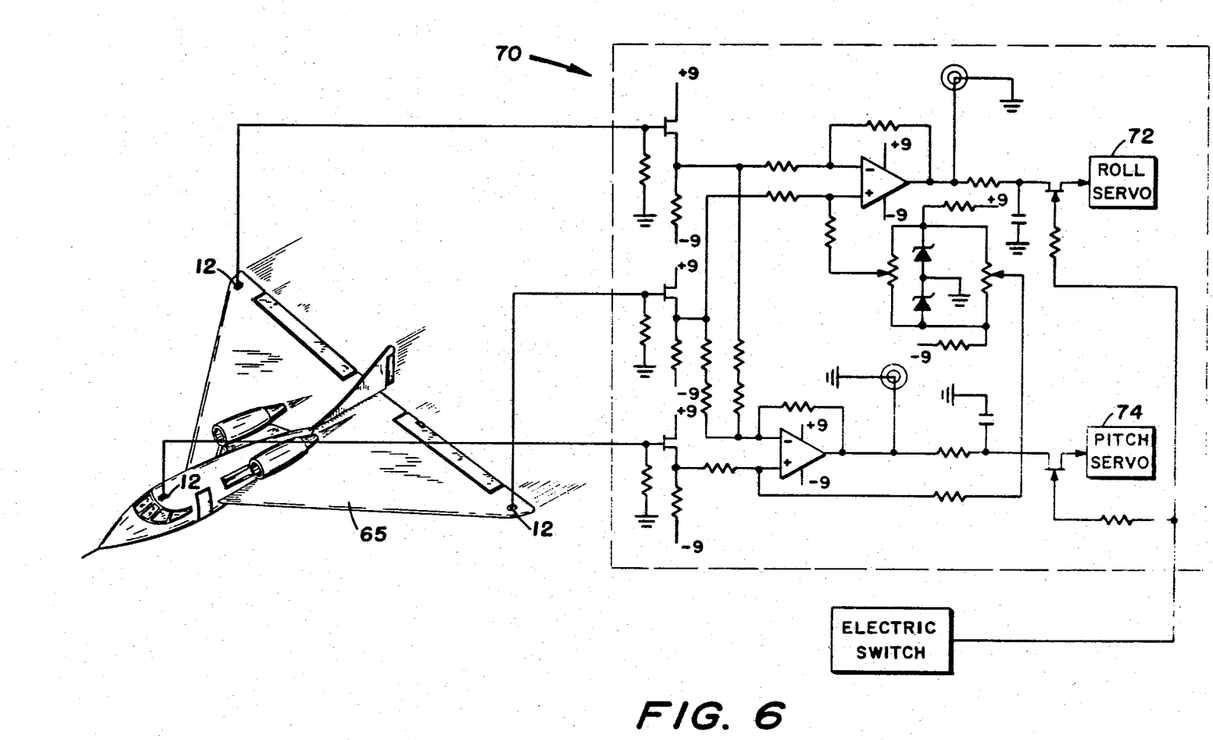
FIG. 6 is a schematic view of an aircraft fitted with an equipotential plane detector comprised of three voltage sensing probes, the detector being shown in part as a detailed circuit diagram.

Simultaneous stabilization in pitch and roll may also be accomplished using the system 70 shown in FIG. 6. Three probes 12 are located on an aircraft 65, the aircraft incidentally being of a Delta-wing configuration. Two of the probes 12 are disposed along a line toward the rear of the aircraft 65, the third probe 12 being located on the forward portion of the aircraft. The forward probe 12 need not lie in the same horizontal plane as do the other two probes 12 since, as is the case with the several voltmeter stabilization units described above, the differential voltage amplifiers 14 may be adjusted to a zero static voltage reading such that all of the probes 12 need not lie in the equipotential plane being defined. The two rearwardly disposed probes 12 are used for roll control and the forwardly disposed probe 12 is referenced to the "electrical center" of the rear probes 12 to provide pitch control. Essentially, the rear probes 12 combine with a differential voltage amplifier as has previously been described to control the roll stability of the aircraft 65 by feeding an output signal to a roll servomechanical apparatus 72. Since the sum of the voltages sensed by the rear probes 12 with respect to the center point is essentially zero as a function of pitch, the forward probe 12 is referenced to this voltage in order to determine the pitch angle of the aircraft. In essence, the forward probe 12 is referenced to the electrical center of the rear probes 12, the rear probes 12 functioning as the equivalent of an extra probe 12 which changes in total potential with changes in elevation independently of whether the aircraft is level or in a bank orientation. In this fashion, an output signal proportional to the pitch angle of the aircraft 65 is obtained and is fed to a pitch servomechanical apparatus 74 for correction in order to maintain a desired pitch orientation.

Figure 7:
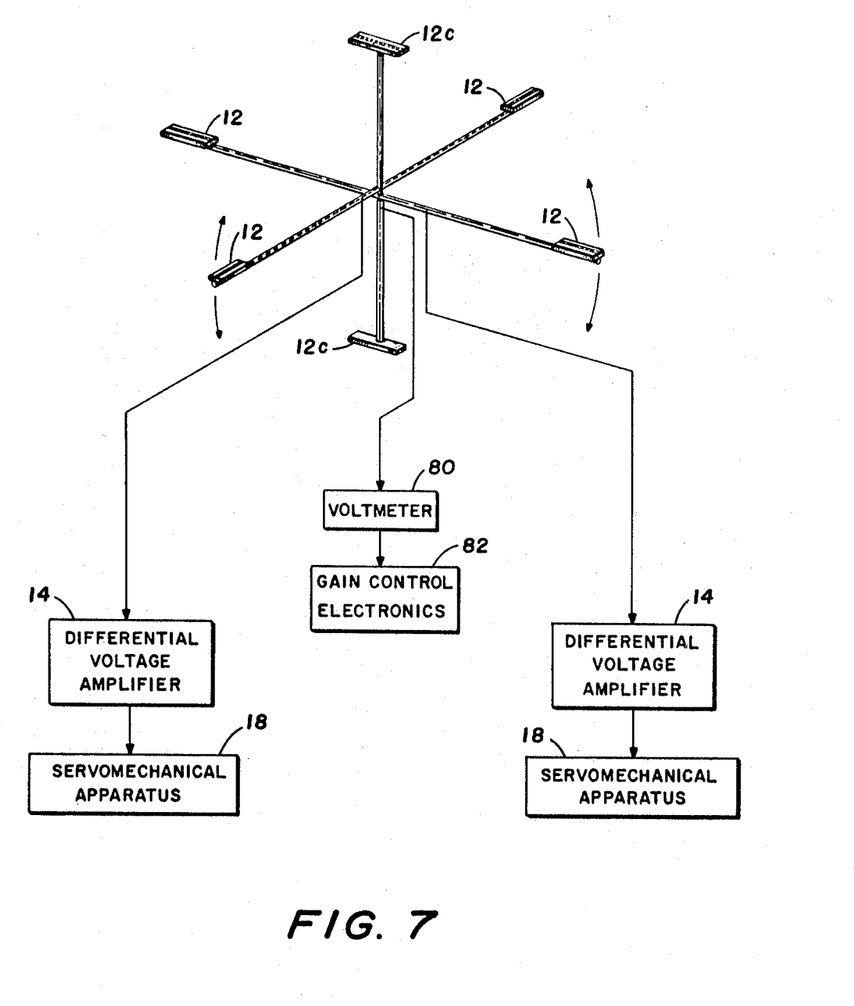
FIG. 7 is an idealized schematic view of an equipotential plane detector having additional voltage sensing probes for automatic gain control; and, FIG. 8 is a detailed diagram of the circuitry employed to determine the roll rate of an airborne vehicle.

Use of the voltmeter pair as described relative to FIG. 5 or the three-probe system shown in FIG. 6 as an aircraft stabilization system requires provision for signal gain adjustment at altitudes greater than a few thousand feet. For example, the amplitude of the signals obtained from a voltmeter 10 at 10,000 feet above the earth's surface is decreased five-fold relative to signal amplitude at an altitude of 3000 feet. This decrease in signal strength occurs due to the change in the static potential gradient with respect to altitude, the static potential gradient at sea level typically being about 180 volts/meter and as low as 10 to 20 volts/meter at an altitude of 20,000 feet. Thus, signal adjustment in the form of gain control is necessary to compensate for the decreased magnitude of the static voltage gradient at relatively high altitudes. While gain control may be provided in a number of well-known ways, an extra pair of probes 12c, such as shown in FIG. 7, may be used to sense the actual magnitude of the static potential gradient at the altitude at which an aircraft is operating, this information then being used to adjust the gain of any feedback signals being derived from the equipotential plane sensor comprised of the two voltmeters 10. The probes 12c are mounted on a vertical axis with respect to the horizontal axes joining the probes 12 of the voltmeters 10. The probes 12c are spaced apart vertically at a suitable distance so as to obtain an insignificant signal to noise ratio, the spacing being on the order of a foot or more. The probes 12c continuously sense the magnitude of the local potential gradient which is then measured by a voltmeter 80, the output signal of said voltmeter being used to actuate well-known gain control electronics 82. In addition to compensating for signal strength loss at altitude, the probes 12c lying along a vertical axis would also respond to small local variations in the static potential gradient which often occur due to atmospheric inversions or excess atmospheric ionization. Thus, addition of the probes 12c to the equipotential plane sensor comprised of the voltmeters 10 would improve the signal-to-noise ratio of the equipotential plane sensor. In addition, the probes 12c combined with the voltmeter 80 can be used to measure local variations in the static potential gradient which can be indicative of radioactive material on or below the surface of the earth, pollution sources, etc.

The device shown in FIG. 7 provides an instantaneous, accurate mechanism for automatic gain control. In most applications, an average value of the static potential gradient is adequate for providing gain control. Thus, it would not usually be necessary to mount the probes 12c on a gimballed-feedback-servomechanical platform to maintain the probes 12c in a vertical orien on. Further, only one sensing probe 12c located above or below the equipotential plane defined by the voltmeters 10 may be used for gain control. Essentially, the output of this single sensing probe 12c would be compared to the zero output of the equipotential plane defined by the voltmeters 10.

Figure 8:
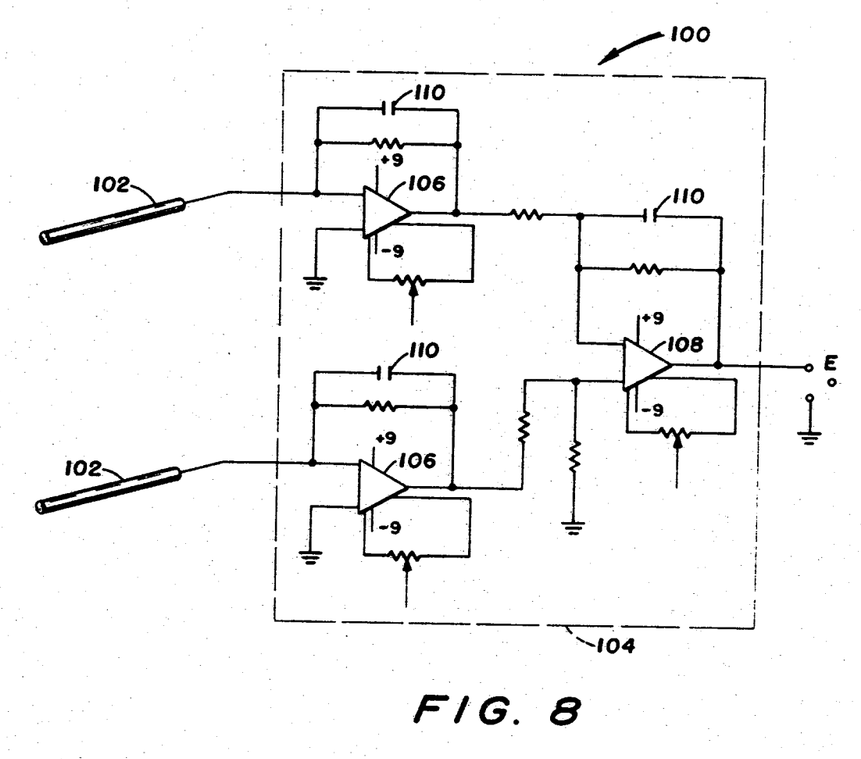

The invention may also be extended to the fabrication of a roll rate or pitch rate sensing device such as is shown at 100 in FIG. 8. The device 100 senses roll or pitch rate based on the physical principle that a displacement current is induced in an electrically conductive rod or wire on rotation of same in an electric field. The device 100 has two conductive rods 102 which may be disposed on the wingtips of an aircraft. Although the rods 102 are exposed to a continuously changing voltage field, a static electric field cannot exist in the rods. Thus, as displacement (rotation) of the rods occur, electric charges flow from one rod 102 to the other rod. A current meter 104 inserted in the circuit between the rods 102 measures the current flowing between the rods 102, the direction of the current indicating the direction of the roll or pitch of an aircraft and the magnitude of the current indicating the rate of the roll or pitch.

The current meter 104 produces an output Eo which is a voltage signal proportional to the current flowing between the rods 102. Operational amplifiers 106 convert the current flow in the circuit to a voltage signal while providing an effective short circuit between the rods 102. Operational amplifier 108 essentially functions as a differential voltmeter to measure the difference in potential between the amplifiers 106. Capacitors 110 are used to eliminate 60 cycle interference commonly encountered in the atmosphere rear power sources, etc. The output Eo of the current meter 104 may be applied to conventional servomechanical apparatus (not shown) or read out devices to control the roll or pitch rate of an aircraft or to inform the pilot. Mounting of the rods 102 on the wingtips or about the transverse axis of an aircraft yields roll rate information while mounting said rods on or about the longitudinal axis of the aircraft yields pitch rate information.

Usual practice in autopilot stabilization involves the combination of attitude and rate information. In the present invention, either the voltmeter 10 of FIG. 1 inter alia and the rate sensing device 100 of FIG. 8 can be modified to produce an output signal which is a combination of both attitude and roll rate information. This combination of information may be accomplished by adjusting the input impedance of the particular circuit, the length of the electrical conductors connected to the sensing probes 12, or the intensity of radiation from the sensing probes if the probes are radioactive. In practice, the voltmeter 10 of FIG. 2 produces some rate information even as the device 100 of FIG. 8 produces some attitude information.

The invention disclosed herein may be practiced with modification to the structures and methods outlined above without departing from the scope of the invention as recited in the appended claims. For example, the probes 12 may be disposed at an angle to the roll axis or pitch axis of an airborne vehicle being stabilized according to the invention. The angle at which a line joining the probes 12 may make with the roll axis or pitch axis can approach 45°. Well-known "calibration" techniques can be employed to adjust the voltmeter 10 to compensate for this angular misalignment.

I claim:
1. A method of defining an equipotential line in a static electric field, comprising the steps of:
   sensing the electrostatic potential at each of two spaced points in the field;
   comparing the two sensed potentials to determine the difference in potential between the points; and,
   adjusting the position of at least one of the points to cause the potential difference between the points to be zero, the line joining the two points being an equipotential line wherein the electrostatic potentials taken at every point on the line are essentially equal.

2. A method of defining an equipotential plane in a static electric field, comprising the steps of:
   sensing the electrostatic potential at each of at least three points in the field;
   generating a potential difference signal proportional to the magnitude of the difference in potential between at least two of the points;
   adjusting the position of at least one of the points from which the difference signal was generated to cause the difference signal to be essentially zero, thereby aligning the points along an equipotential line;
   comparing the potential sensed at a third point to the potential existing along the equipotential line joining at least the two aforesaid points; and,
   adjusting the position of the third point relative to the equipotential line so that the potential difference between the third point and the equipotential line is essentially zero, the third point and the equipotential line thus defining an equipotential plane wherein the electrostatic potentials taken at every point of the plane are essentially equal.

3. A method of defining an equipotential plane in the static electric field existing in the earth's atmosphere, comprising the steps of:
   sensing the electrostatic potential at each of at least three non-linear points in the atmosphere;
   generating a potential difference signal proportional to the magnitude of the difference in potential between at least two of the points;
   adjusting the position of at least one of the points from which the difference signal was generated to cause the difference signal to be essentially zero, thereby aligning at least the two aforesaid points along an equipotential line;
   generating a potential difference signal proportional to the magnitude of the difference in potential between a third point and the equipotential line joining at least the two aforesaid points; and,
   adjusting the position of the third point relative to the equipotential line so that the magnitude of the potential difference signal between the sensed potential at the third point and the potential along the equipotential line is essentially zero, the third point and the equipotential line thus defining an equipotential plane wherein the electrostatic potentials taken at every point on the plane are essentially equal.

4. A method of defining an equipotential plane in the static electric field existing in the earth's atmosphere, comprising the steps of:
   sensing the electrostatic potential at each of at least three non-linear points in the atmosphere;
   comparing the potentials sensed at each of at least two of the points to determine the difference in potential between the points;
   adjusting the position of at least one of the points to cause the potential difference between the points to be zero, thereby aligning at least the two aforesaid points along an equipotential line;
   comparing the potential sensed at a third point to the potential existing along the equipotential line joining at least the two aforesaid points; and,
   adjusting the position of the third point relative to the equipotential line so that the potential difference between the third point and the equipotential line is essentially zero, the third point and the equipotential line thus defining an equipotential plane wherein the electrostatic potentials taken at every point of the plane are essentially equal.

5. The method of claim 3 wherein the equipotential plane is defined relative to the surface of the earth, the three points lying in a plane parallel to the surface of the earth on adjustment of the positions thereof to cause said points to be at equal potentials.

6. A method of defining an equipotential plane in the static electric field existing in the earth's atmosphere, comprising the steps of:
   sensing the electrostatic potential at each point of two non-linear pairs of spaced points in the atmosphere;
   comparing the sensed potentials of the two points in each pair of spaced points to determine the difference in potential between the points in each pair of points; and,
   adjusting the position of at least one of the points in each pair of points to cause the potential difference between said points in each pair of points to be zero, each pair of points thereby defining an equipotential line, the plane in which the two equipotential lines thus defined lie being an equipotential plane.

7. Apparatus for detecting an equipotential line in a static electric field, comprising:
   at least two static voltage sensing probes disposed at spaced points in the field;
   means electrically connected to the probes for receiving the potentials sensed by said probes and for producing an output signal proportional to the difference in sensed potential between the probes; and,
   means for adjusting the position of at least one of the probes to cause the output signal to be zero, the line joining the probes when said output signal is zero defining an equipotential line.

8. Apparatus for detecting an equipotential plane in a static electric field, comprising:
   two pairs of static voltage sensing probes, the probes in each pair of probes being disposed at spaced points in the field;
   two differential amplifiers, one each of said amplifiers being electrically connected to one pair of probes for receiving the potentials sensed by the sensing probes of each pair of probes, each said amplifier producing an output signal which is proportional to the difference in sensed potential between the sensing probes of each pair of probes; and,
   means for adjusting the position of at least one of the probes of each pair of probes to cause the output signal of the amplifiers respectively connected thereto to be zero, the plane in which the sensing probes effectively lie when the output signals of both amplifiers are zero being an equipotential plane.

9. Apparatus for detecting an equipotential plane in a static electic field, comprising:
   at least three static voltage sensing probes disposed at spaced, non-linear points in the field;
   differential voltage comparison means electrically connected to two of the probes for receiving the potentials sensed by said probes and for producing a first output signal proportional to the difference in sensed potential between the probes;
   means for adjusting the position of at least one of the two probes to cause the first output signal to be zero, the line joining the two probes when said output signal is zero defining an equipotential line;
   means for referencing the sensed potential of the third probe to the equipotential line defined by the aforesaid pair of probes, a second output signal being generated which is proportional to the difference in potential between that potential sensed by the third probe and the potential along the equipotential line; and,
   means for adjusting the position of the third probe relative to the equipotential line to cause the second output signal to be zero, the plane in which the sensing probes lie when the first and second output signals are zero being an equipotential plane.

10. A method for defining an equipotential line in the static electric field existing in the earth's atmosphere, comprising the steps of:
   sensing the electrostatic potential at each of two spaced points in the atmosphere;
   generating a potential difference signal proportional to the magnitude of the difference in the two sensed potentials, the magnitude of the signal being proportional to the angular misalignment of a straight line joining the two points and an equipotential line intersecting the line adjoining the two points; and adjusting the position of at least one of the points in response to the generated potential difference signal to cause the potential difference between said points to be zero, the equipotential line thereby defined being parallel to the surface of the earth.

* * * * *